United States Patent
Tsai et al.

(10) Patent No.: US 11,616,061 B2
(45) Date of Patent: Mar. 28, 2023

(54) CUT METAL GATE WITH SLANTED SIDEWALLS

(71) Applicant: Taiwan Semiconductor Manufacturing Co., Ltd., Hsinchu (TW)

(72) Inventors: Ya-Yi Tsai, Hsinchu (TW); Chun-Liang Lai, Hsinchu (TW); Shu-Yuan Ku, Hsinchu County (TW); Ryan Chia-Jen Chen, Chiayi (TW); Ming-Ching Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/195,258

(22) Filed: Nov. 19, 2018

(65) Prior Publication Data
US 2019/0088650 A1    Mar. 21, 2019

Related U.S. Application Data

(62) Division of application No. 15/904,835, filed on Feb. 26, 2018, now Pat. No. 10,535,654.
(Continued)

(51) Int. Cl.
*H01L 27/088* (2006.01)
*H01L 27/02* (2006.01)
(Continued)

(52) U.S. Cl.
CPC .... *H01L 27/0886* (2013.01); *H01L 21/31122* (2013.01); *H01L 21/32135* (2013.01);
(Continued)

(58) Field of Classification Search
CPC ..... H01L 21/76224–76237; H01L 21/823481; H01L 21/823878; H01L 29/66545;
(Continued)

(56) References Cited

U.S. PATENT DOCUMENTS 5,143,866 A    9/1992  Matsutani
8,772,109 B2   7/2014  Colinge
(Continued)

FOREIGN PATENT DOCUMENTS

CN    102347227 A    2/2012
CN    103117213 A    5/2013
(Continued)

OTHER PUBLICATIONS

Hsu, Kuo-Hsiu et al., "SRAM Cell with Balanced Write Port", U.S. Appl. No. 15/625,490 filed Jun. 16, 2017, 41 pages.
(Continued)

*Primary Examiner* — Nelson Garces
(74) *Attorney, Agent, or Firm* — Haynes and Boone, LLP

(57) ABSTRACT

A method includes providing a structure having a substrate, semiconductor fins, and an isolation structure between adjacent semiconductor fins; forming a first gate structure engaging the semiconductor fins; depositing an inter-layer dielectric layer over the semiconductor fins and the first gate structure; removing the first gate structure, resulting in a first trench; depositing a second gate structure into the first trench, wherein the second gate structure includes a dielectric layer and a conductive layer; forming one or more mask layers over the second gate structure; patterning the one or more mask layers to have an opening exposing a portion of the second gate structure between two adjacent semiconductor fins; and etching the second gate structure through the
(Continued)

opening to produce a second trench having tapered sidewalls, wherein the second trench is wider at top than at bottom.

19 Claims, 12 Drawing Sheets

Related U.S. Application Data

(60) Provisional application No. 62/551,903, filed on Aug. 30, 2017.

(51) Int. Cl.

| | | |
|---|---|---|
| *H01L 29/423* | (2006.01) | |
| *H01L 29/06* | (2006.01) | |
| *H01L 21/8234* | (2006.01) | |
| *H01L 21/3213* | (2006.01) | |
| *H01L 29/66* | (2006.01) | |
| *H01L 21/8238* | (2006.01) | |
| *H01L 27/092* | (2006.01) | |
| *H01L 21/311* | (2006.01) | |
| *H01L 21/027* | (2006.01) | |
| *H01L 21/3105* | (2006.01) | |

(52) U.S. Cl.
CPC .. *H01L 21/32136* (2013.01); *H01L 21/32137* (2013.01); *H01L 21/823431* (2013.01); *H01L 21/823437* (2013.01); *H01L 21/823481* (2013.01); *H01L 21/823821* (2013.01); *H01L 27/0207* (2013.01); *H01L 27/0924* (2013.01); *H01L 29/0649* (2013.01); *H01L 29/42364* (2013.01); *H01L 29/42376* (2013.01); *H01L 29/66545* (2013.01); *H01L 21/0274* (2013.01); *H01L 21/31053* (2013.01); *H01L 21/32139* (2013.01)

(58) Field of Classification Search
CPC ......... H01L 27/0886; H01L 21/823431; H01L 21/308–3083; H01L 29/66606; H01L 29/66871; H01L 21/823821; H01L 27/0924; H01L 21/31122; H01L 21/32137; H01L 21/32136; H01L 27/0207; H01L 29/42364; H01L 29/42376; H01L 29/0649; H01L 21/823437; H01L 21/32135; H01L 21/0274; H01L 21/31053; H01L 29/42312; H01L 29/6656; H01L 29/49; H01L 29/41791; H01L 21/32139
See application file for complete search history.

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,980,763 B2 | 3/2015 | Wang et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 * | 12/2016 | Chang | H01L 21/823864 |
| 9,576,814 B2 | 2/2017 | Wu et al. | |
| 9,627,379 B1 * | 4/2017 | Chang | H01L 27/0886 |
| 2012/0205774 A1 * | 8/2012 | Wang | H01L 21/76232 |
| | | | 257/E21.546 |
| 2016/0300755 A1 | 10/2016 | Gan et al. | |
| 2016/0351568 A1 * | 12/2016 | Chang | H01L 29/517 |
| 2017/0110454 A1 * | 4/2017 | Chang | H01L 27/0886 |
| 2017/0125411 A1 * | 5/2017 | Yu | H01L 21/76232 |
| 2017/0222055 A1 * | 8/2017 | Chang | H01L 29/66795 |
| 2018/0096846 A1 * | 4/2018 | Arnold | H01L 21/31138 |

FOREIGN PATENT DOCUMENTS

| | | |
|---|---|---|
| CN | 106711045 A | 5/2017 |
| EP | 0023429 B1 | 12/1985 |
| KR | 20160094244 | 8/2016 |

OTHER PUBLICATIONS

Cheng, Chao-Ching et al., "Gate Stacks for Stack-Fin Channel I/O Devices and Nanowire Channel Core Devices", U.S. Appl. No. 15/719,686, filed Sep. 29, 2017, 55 pages.

* cited by examiner

CUT METAL GATE WITH SLANTED SIDEWALLS

PRIORITY

This is a divisional of U.S. patent application Ser. No. 15/904,835, filed Feb. 26, 2018, which claims the benefits of U.S. provisional application Ser. No. 62/551,903, filed Aug. 30, 2017, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate with a metal gate to improve device performance with the decreased feature sizes. One process of forming a metal gate is termed a replacement gate or "gate-last" process in which the metal gate is fabricated "last" which allows for reduced number of subsequent processes, including high temperature processing, that must be performed after formation of the gate. However, there are challenges to implementing such IC fabrication processes, especially with scaled down IC features in advanced process nodes, such as N10, N5, and beyond. One challenge is how to effectively isolate the metal gates after the replacement.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
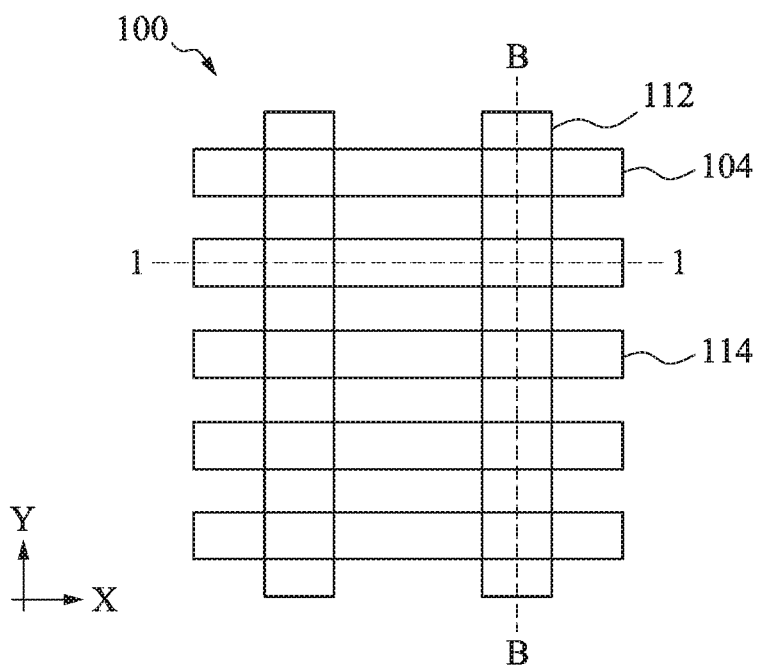
FIG. 1A shows a top view of a semiconductor structure implemented with a cut metal gate process, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and fabrication methods, and more particularly to fabricating semiconductor devices using a cut metal gate process. A cut metal gate process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more portions. Each portion functions as a metal gate for an individual transistor. An isolation material is subsequently filled into trenches between adjacent portions of the metal gate. These trenches are referred to as cut metal gate trenches, or CMG trenches, in the present disclosure. As the device scaling down continues, the aspect ratio of the CMG trenches (defined as the ratio of the height of a CMG trench to the width of the CMG trench) generally increases. This makes it more difficult to completely fill the CMG trenches with the isolation material when the CMG trenches have vertical sidewalls. If a gap or void exists in this isolation material, it might cause circuit defects, such as short circuits. An object of the present disclosure is to devise a cut metal gate method so as to produce a CMG trench to have a tapered profile with its top opening wider than its bottom opening. In other words, the CMG trench so produced has slanted sidewalls. Such tapered profile helps the filling of the isolation material into the CMG trench to eliminate gap or voids in the isolation material. Such tapered profile is particularly useful for CMG trenches with high aspect ratio, such as 5 to 10.

Figure 1B:
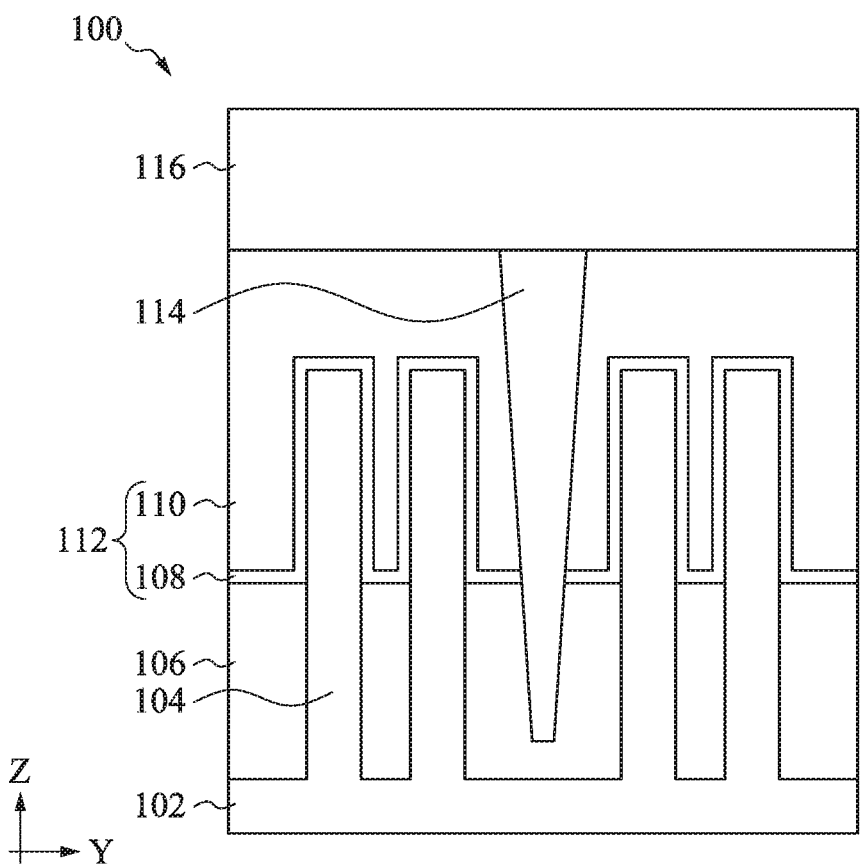
FIGS. 1B and 1C show cross-sectional views of the structure in FIG. 1A, in accordance with an embodiment.

FIG. 1A illustrates a top view of a semiconductor device (or semiconductor structure) 100. FIG. 1B illustrates a cross-sectional view of the device 100 along the B-B line of FIG. 1A. Referring to FIGS. 1A and 1B, the device 100 includes a substrate 102, a plurality of fins 104 protruding out of the substrate 102, an isolation structure 106 over the substrate 102 and between the fins 104, and a plurality of gate stacks 112 disposed over the fins 104 and the isolation structure 106. Each gate stack 112 includes a high-k dielectric layer 108, and a conductive layer 110 over the high-k dielectric layer 108. The conductive layer 110 includes one or more layers of metallic materials. Therefore, each gate stack 112 is also referred to as a high-k metal gate (or HK MG) 112. The gate stacks 112 may further include an interfacial layer (not shown) under the high-k dielectric layer 108.

From the top view, the fins 104 are arranged lengthwise along the X direction, and the gate stacks 112 are arranged lengthwise along the Y direction which is generally perpendicular to the X direction. Further, the fins 104 are generally parallel to each other, and the gate stack 112 are generally parallel to each other. The device 100 further includes a dielectric layer 114 that is arranged lengthwise along the X direction and separates each piece of the gate stacks 112 into at least two portions. Each portion of the gate stacks 112 engages the respective fins 104 to form individual FinFET transistors. The device 100 further includes one or more dielectric layers 116 disposed over the gate stacks 112 and the dielectric layer 114. The components of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The fins 104 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 104 may include alternately stacked layers of two different semiconductor materials, such as layers of silicon and silicon germanium alternately stacked. The fins 104 may additionally include dopants for improving the performance of the device 100. For example, the fins 104 may include n-type dopant(s) such as phosphorus or arsenic, or p-type dopant(s) such as boron or indium.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features. Other isolation structure such as field oxide, LOCal Oxidation of Silicon (LOCOS), and/or other suitable structures are possible. The isolation structure 106 may include a multi-layer structure, for example, having one or more thermal oxide liner layers adjacent to the fins 104.

The high-k dielectric layer 108 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof.

The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

The dielectric layer 114 may include one or more dielectric materials, such as silicon nitride, silicon oxide, silicon oxynitride, fluoride-doped silicate glass (FSG), a low-k dielectric material, and/or other suitable insulating material. Particularly, the portion of the dielectric layer 114 in physical contact with the gate stacks 112 includes a dielectric material that does not react with the metal materials of the gate stack 112. For example, that portion of the dielectric layer 114 includes silicon nitride in an embodiment.

The dielectric layer 116 may include one or more dielectric materials, such as silicon nitride, silicon oxide, silicon oxynitride, fluoride-doped silicate glass (FSG), a low-k dielectric material, and/or other suitable insulating material.

Figure 1C:
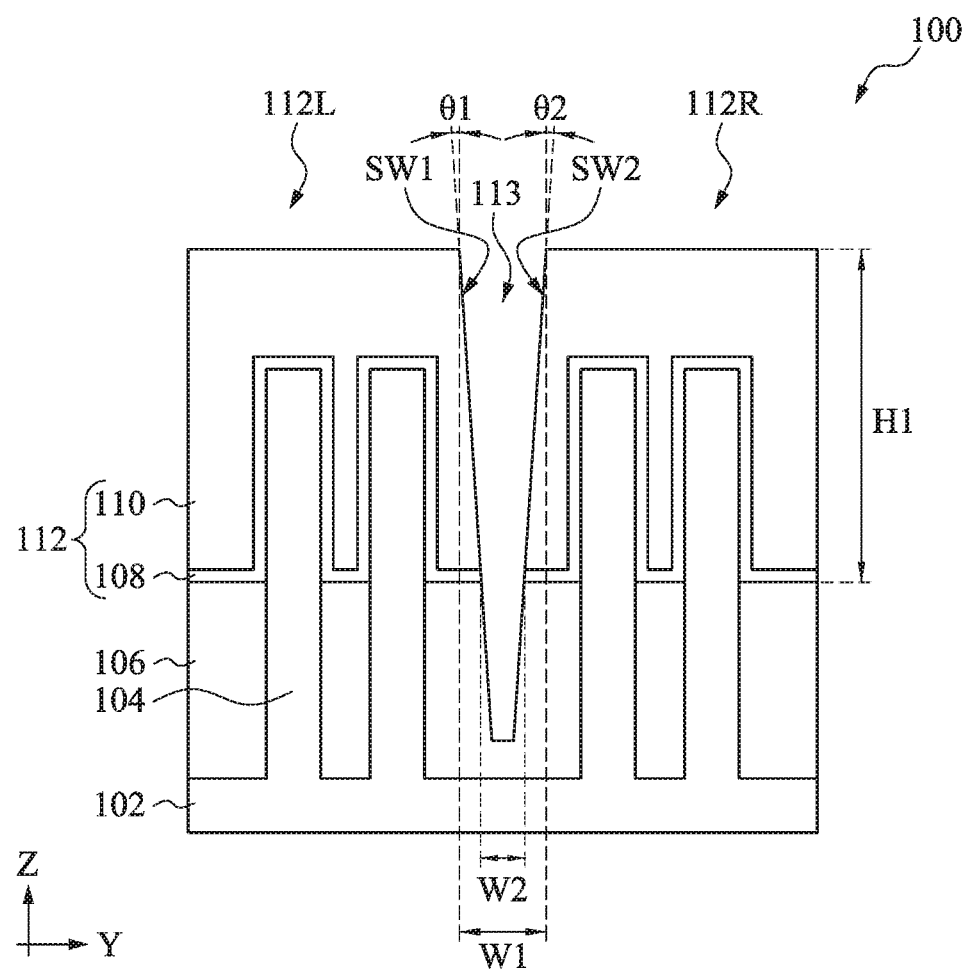

With reference to FIG. 1C, the device 100 is further explained. In FIG. 1C, the dielectric layers 114 and 116 are omitted in order to illustrate the details of a cut metal gate (CMG) trench 113. In this cross-sectional view, the CMG trench 113 separates a gate stack 112 into left and right portions, 112L and 112R. The left portion 112L engages two fins 104 to form a transistor, and the right portion 112R engages two other fins 104 to form another transistor. In various embodiments, the left (or right) portion may engage any number of the fins 104 to form a transistor. The left portion 112L has a sidewall SW1 that is slanted from top to bottom towards the right portion 112R. The sidewall SW1 forms an angle θ1 with the Z direction, a normal of the substrate 102. The right portion 112R has a sidewall SW2 that is slanted from top to bottom towards the left portion 112L. The sidewall SW2 forms an angle θ2 with the Z direction. The CMG trench 113 extends into the isolation structure 106 to ensure that the left and right portions of the gate stack 112 are completely isolated from each other. The gate stack 112 has a height H1 along the Z direction as measured from the interface between the gate stack 112 and the isolation structure 106 to the top surface of the gate stack 112. The CMG trench 113 has a top opening at the top surface of the gate stack 112, and a bottom opening at the interface between the gate stack 112 and the isolation structure 106. The top opening has a width W1, and the bottom opening has a width W2. An aspect ratio of the CMG trench 113 is defined to be H1/W1.

In an embodiment, the height H1 may range from 80 to 140 nm, and the top opening width W1 may range from 16 to 30 nm. The aspect ratio of the CMG trench 113 may range from 3 to 10, such as from 4 to 8, or from 5 to 7. With the high aspect ratio, if the CMG trench 113 had vertical sidewalls (typically, drying etching of a metal film produces vertical sidewalls), it would be difficult for the dielectric layer 114 to completely fill in the CMG trench 113 because existing deposition techniques typically do not deposit well in the bottom of a deep and narrow trench. In the present embodiment, the CMG trench 113 is designed and engineered to have a tapered profile, i.e., having W1 >W2. Experiments have shown that such a tapered profile improves the filling of the electric layer 114 into the CMG trench 113.

In various embodiments, each of the angles θ1 and θ2 is greater than 0° (hence, "slanted" sidewalls) and less than $$\tan^{-1}\left(\frac{1}{2 \times AR}\right),$$

where AR is the aspect ratio of the CMG trench 113 which equals to H1/W1 in the present embodiment. If both angles θ1 and θ2 equal to $$\tan^{-1}\left(\frac{1}{2 \times AR}\right),$$

the CMG trench 113 barely reaches the isolation structure 106. To ensure the isolation between the left and right portions of the gate stack 112, both angles θ1 and θ2 are designed to be less than $$\tan^{-1}\left(\frac{1}{2 \times AR}\right).$$

In an embodiment, the CMG trench 113 is designed so that each of the angles θ1 and θ2 ranges from 1° to 10° (or degrees), such as from 1.5° to 7°, or from 2° to 5°. Such sidewall angles have been found helpful and effective for the filling of the dielectric material 114 into the CMG trench 113 with a high aspect ratio. In embodiments, the two angles θ1 and θ2 may or may not equal to each other.

In some embodiments, the ratio W2/W1 is designed to be from 0.4 to 0.8 such as from 0.5 to 0.7 to ensure that the dielectric layer 114 (FIG. 1B) completely isolates the left and right portions of the gate stack 112 and to ensure that the sidewall angles θ1 and θ2 are large enough for easing film deposition. In practice, the sidewall angles θ1 and θ2 may be derived from the values of W1, W2, and H1.

Figure 2A:
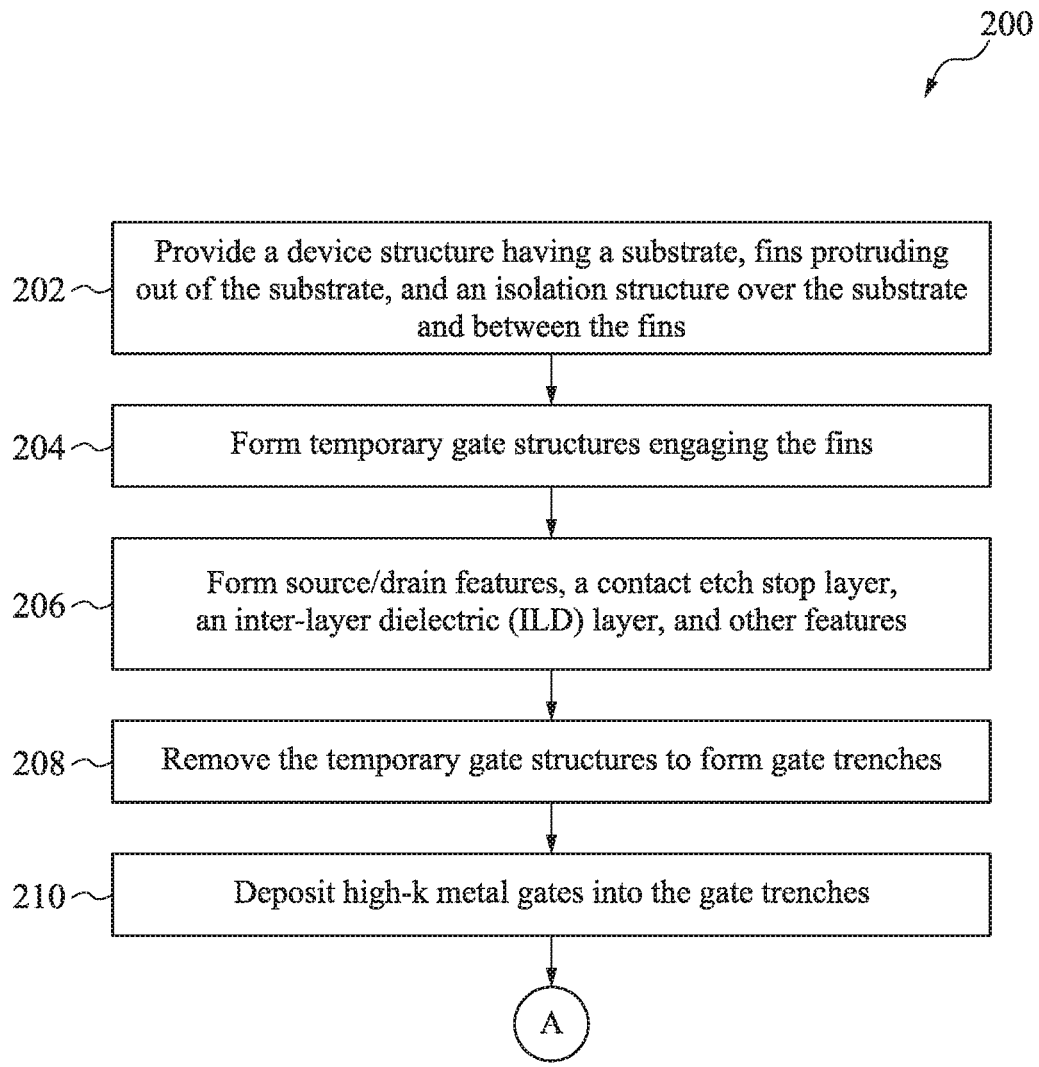
FIGS. 2A and 2B show a flow chart of a method for forming the structure shown in FIGS. 1A-1C, according to aspects of the present disclosure.
Figure 2B:
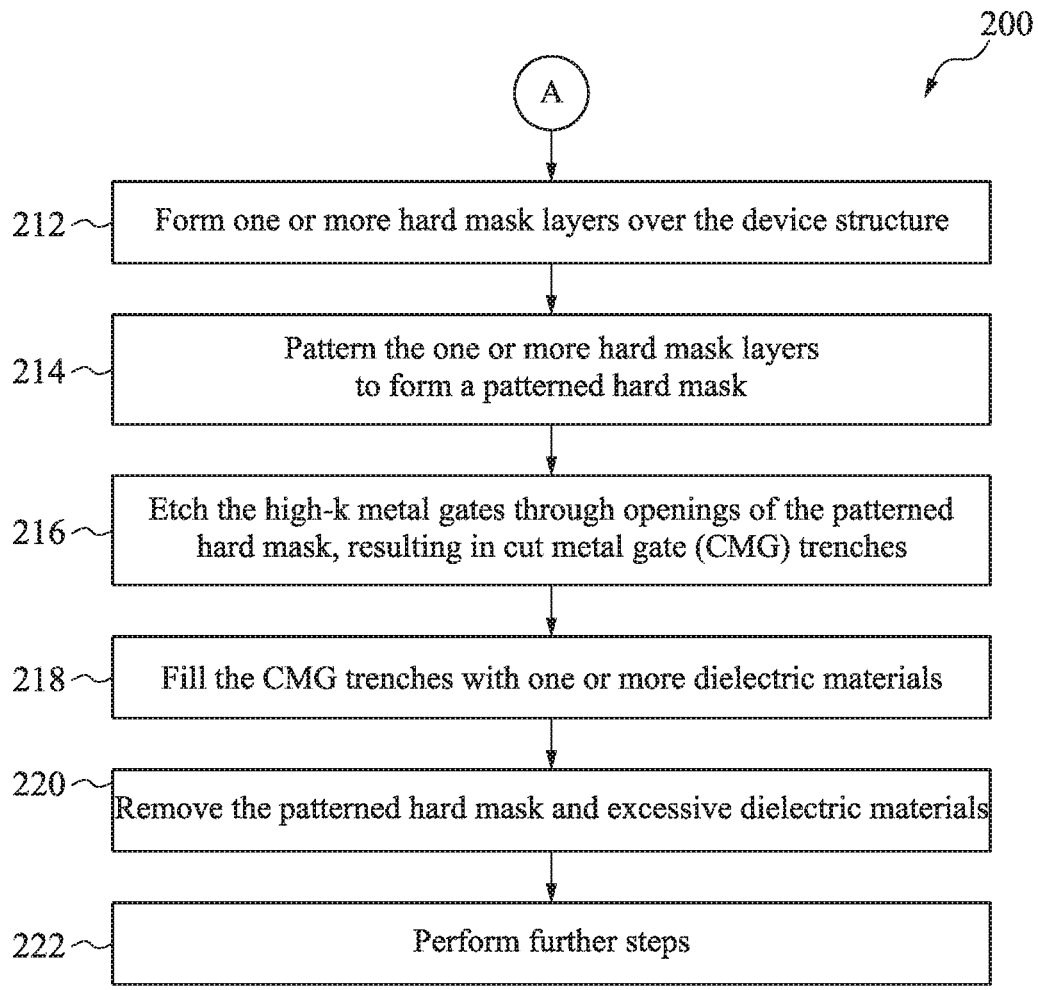

FIGS. 2A and 2B illustrate a flow chart of a method 200 for forming the semiconductor device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-12, which illustrate various cross-sectional views of the semiconductor device 100 during fabrication steps according to the method 200.

Figure 3:
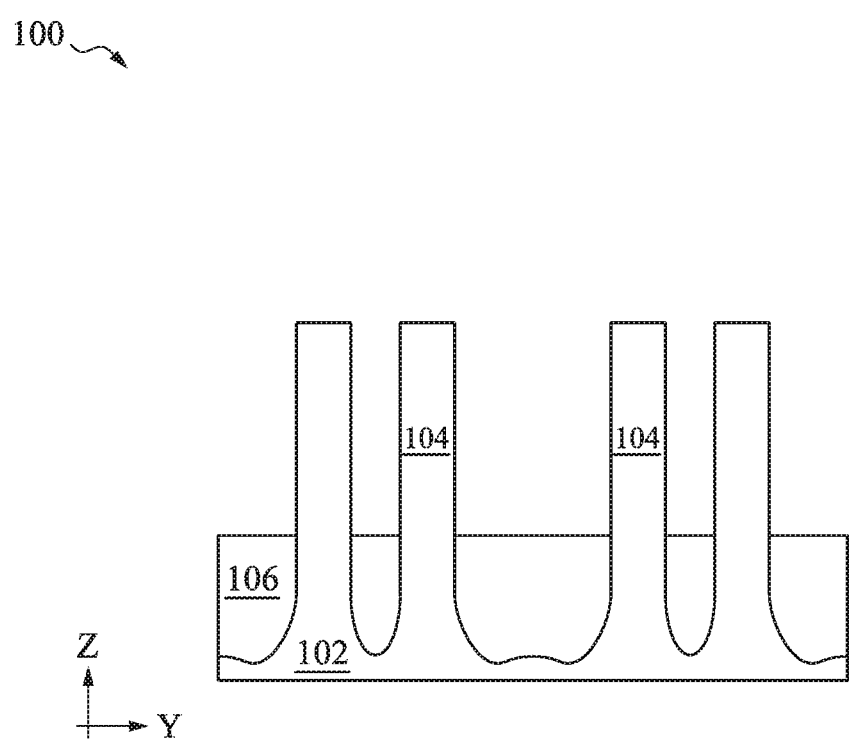
FIGS. 3, 4A, 4B, 5, 6A, 6B, 7A, 7B, 8, 9, 10, 11, and 12 illustrate cross-sectional views of a semiconductor structure during a fabrication process according to the method of FIGS. 2A-2B, in accordance with an embodiment.

At operation 202, the method 200 (FIG. 2A) provides, or is provided with, a device structure 100 having a substrate 102, fins 104 protruding out of the substrate 102, and an isolation structure 106 over the substrate 102 and between the fins 104, such as shown in FIG. 3. The various materials for the substrate 102, the fins 104, and the isolation structure 106 have been discussed above with reference to FIGS. 1A-1C.

In an embodiment, the substrate 102 may be a wafer, such as a silicon wafer. The fins 104 can be formed by epitaxially growing one or more semiconductor layers over the entire area of the substrate 102 and then patterned to form the individual fins 104. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

The isolation structure 106 may be formed by one or more deposition and etching methods. The deposition methods may include thermal oxidation, chemical oxidation, and chemical vapor deposition (CVD) such as flowable CVD (FCVD). The etching methods may include dry etching, wet etching, and chemical mechanical planarization (CMP).

Figure 4A:
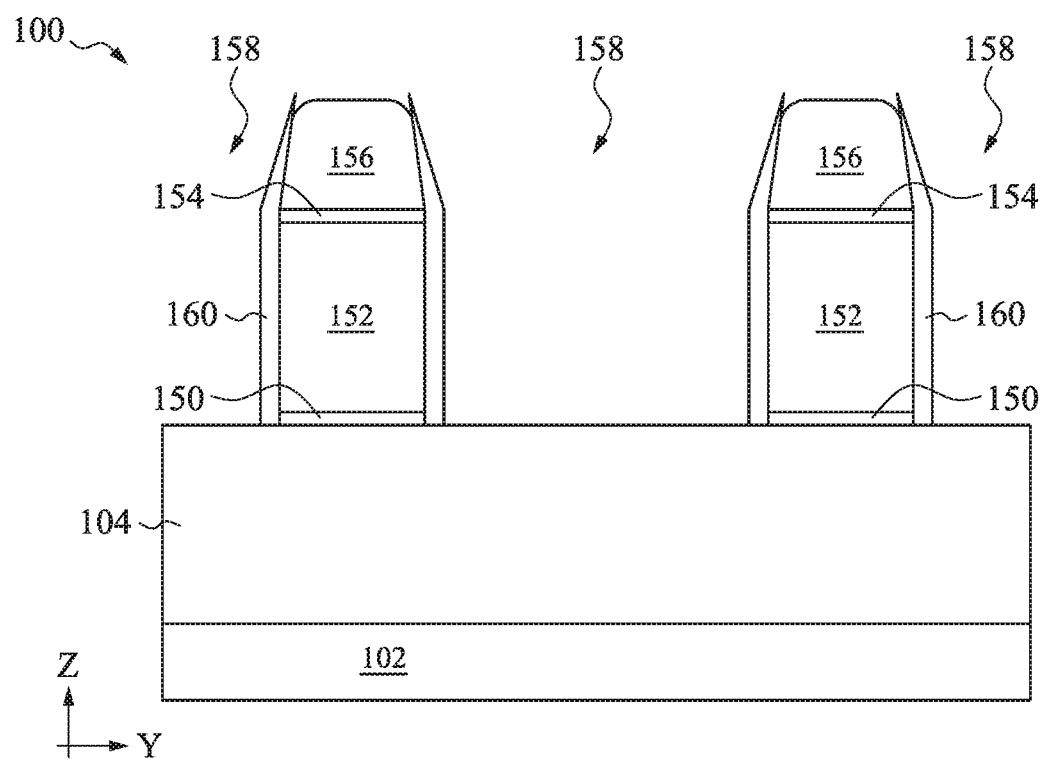
Figure 4B:
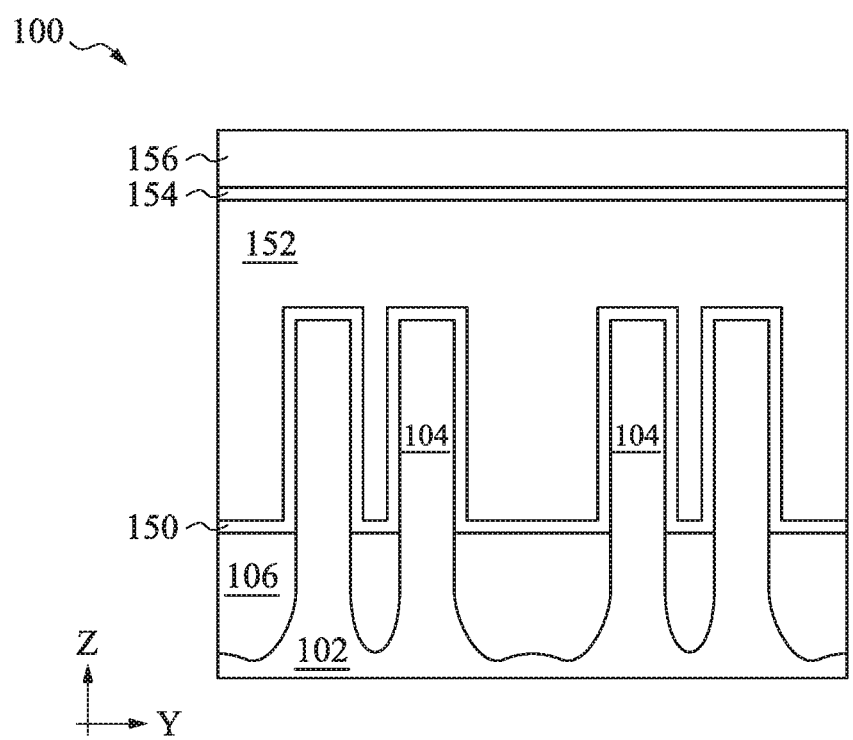

At operation 204, the method 200 (FIG. 2A) forms dummy (or temporary) gate structures engaging the fins 104 such as shown in FIGS. 4A and 4B. FIG. 4A shows a cross-sectional view of the device 100 cut along the 1-1 line of FIG. 1A, while FIG. 4B shows a cross-sectional view of the device 100 cut along the B-B line of FIG. 1A. Referring to FIGS. 4A and 4B, the dummy gate structure includes an interfacial layer 150, an electrode layer 152, and two hard mask layers 154 and 156. The operation 204 further forms the gate spacers 160 on sidewalls of the dummy gate structure.

The interfacial layer 150 may include a dielectric material such as silicon oxide layer (e.g., $SiO_2$) or silicon oxynitride (e.g., SiON), and may be formed by chemical oxidation, thermal oxidation, atomic layer deposition (ALD), CVD, and/or other suitable methods. The gate electrode 152 may include poly-crystalline silicon (poly-Si) and may be formed by suitable deposition processes such as low-pressure chemical vapor deposition (LPCVD) and plasma-enhanced CVD (PECVD). Each of the hard mask layers 154 and 156 may include one or more layers of dielectric material such as silicon oxide and/or silicon nitride, and may be formed by CVD or other suitable methods. The various layers 150, 152, 154, and 156 may be patterned by photolithography and etching processes. The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be formed by depositing a spacer material as a blanket over the isolation structure 106, the fins 104, and the dummy gate structure 150/152/154/156. Then the spacer material is etched by an anisotropic etching process to expose the isolation structure 106, the hard mask layer 156, and a top surface of the fins 104. Portions of the spacer material on the sidewalls of the dummy gate structure 150/152/154/156 become the gate spacers 160. Adjacent gate spacers 160 provide trenches 158 that expose the fins 104 in the S/D regions of the device 100.

Figure 5:
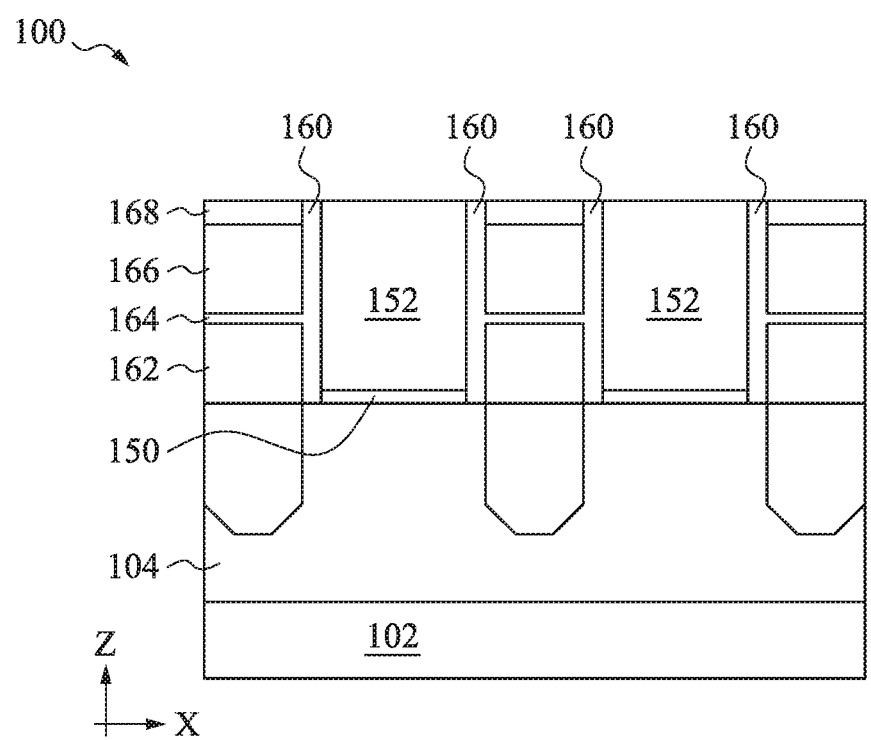

At operation 206, the method 200 (FIG. 2A) forms various features including source/drain (or S/D) features 162, a contact etch stop layer (CESL) 164, an interlayer dielectric (ILD) layer 166, and a protective dielectric layer 168 over the ILD layer 166, such as shown in FIG. 5, which is a cross-sectional view of the device 100 along the 1-1 line of FIG. 1A. For example, the operation 206 may etch recesses into the fins 104 exposed in the trenches 158, and epitaxially grow semiconductor materials in the recesses. The semiconductor materials may be raised above the top surface of the fins 104, as illustrated in FIG. 5. The operations 206 may form the S/D features 162 separately for NFET and PFET devices. For example, the operations 206 may form the S/D features 162 with n-type doped silicon for NFET devices or p-type doped silicon germanium for PFET devices. Thereafter, the operation 206 may deposit the CESL 164 and the ILD layer 166 over the S/D features 162. The CESL 164 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, FCVD, or other suitable methods. Subsequently, the operation 206 may etch back the ILD layer 166 and deposit the protective dielectric layer 168 which may comprise a nitride such as silicon nitride for protecting the ILD layer 166 during subsequent etching processes. The operation 206 performs one or more CMP processes to planarize the top surface of the device 100, remove the hard mask layers 154 and 156, and expose the electrode layer 152.

Figure 6A:
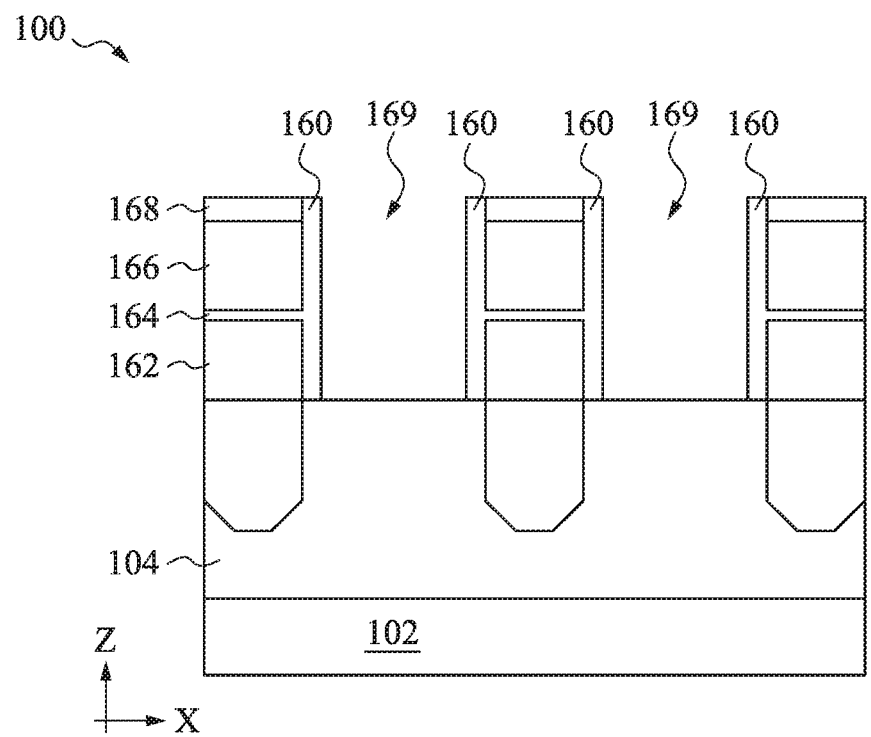
Figure 6B:
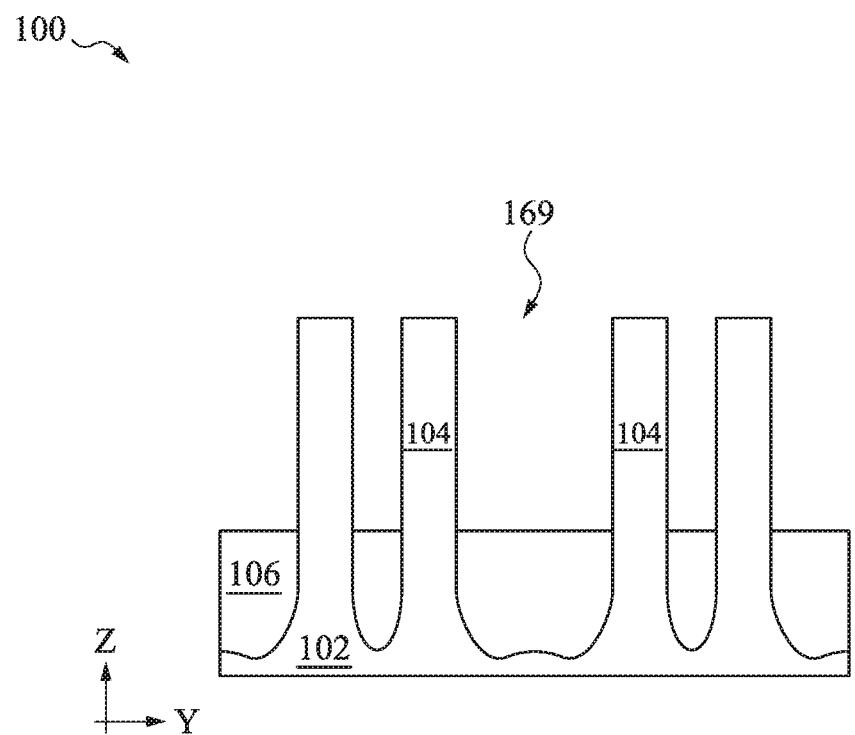

At operation 208, the method 200 (FIG. 2A) removes the dummy gate structures to form gate trenches 169, such as shown in FIGS. 6A and 6B, which are cross-sectional views of the device 100 along the 1-1 and B-B lines of FIG. 1A, respectively. The gate trenches 169 expose surfaces of the fins 104 and sidewall surfaces of the gate spacers 160. The operation 208 may include one or more etching processes that are selective to the material in the electrode layer 152 and the interfacial layer 150. The etching processes may include dry etching, wet etching, reactive ion etching, or other suitable etching methods.

Figure 7A:
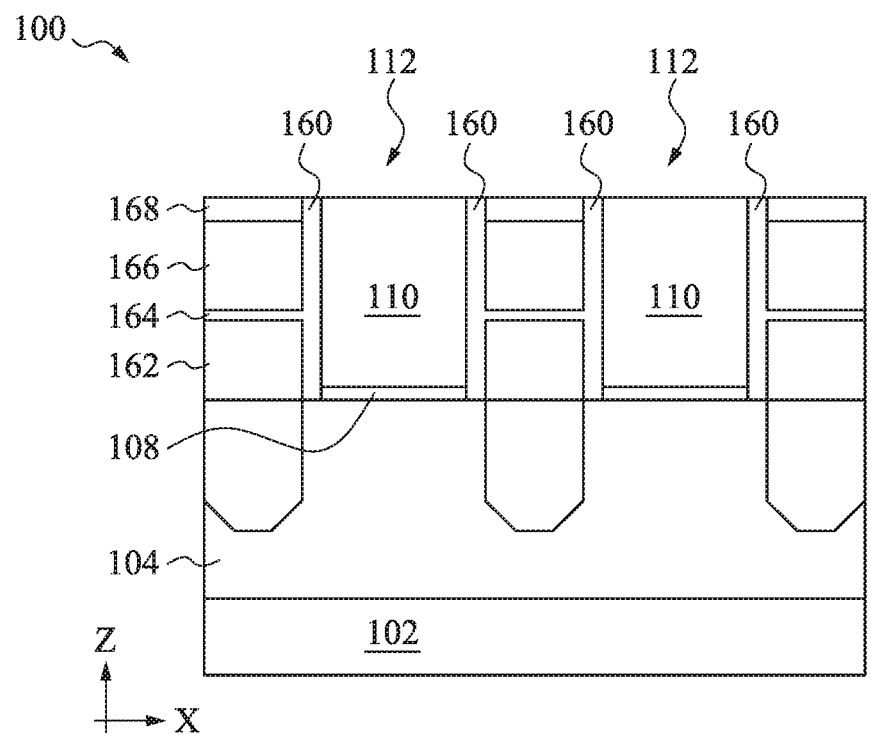
Figure 7B:
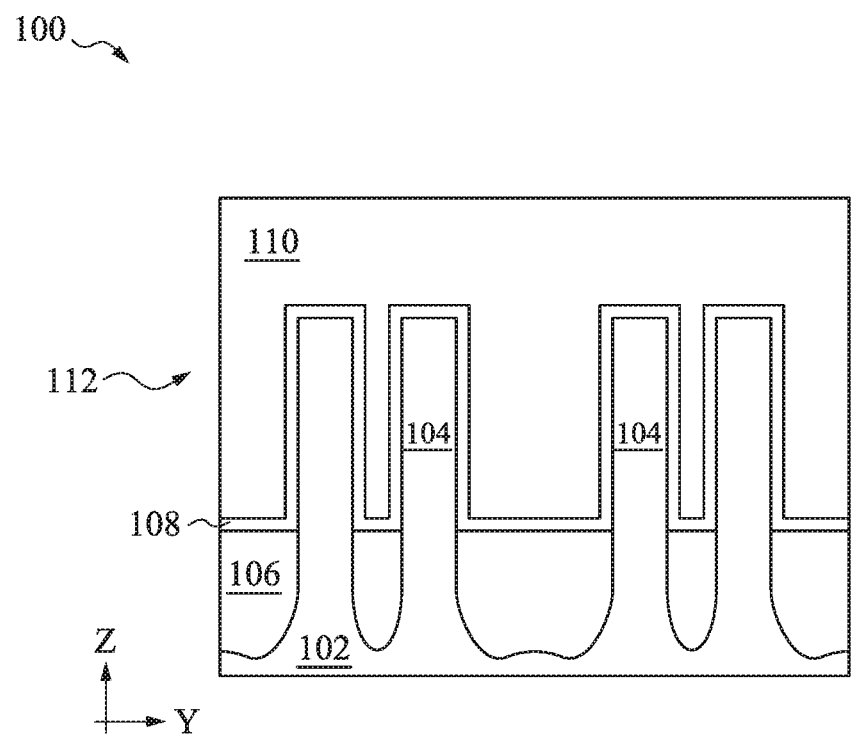

At operation 210, the method 200 (FIG. 2A) deposits high-k metal gates 112 in the gate trenches 169, such as shown in FIGS. 7A and 7B which are cross-sectional views of the device 100 along the 1-1 and B-B lines of FIG. 1A, respectively. The high-k metal gates 112 include the high-k dielectric layer 108 and the conductive layer 110. The high-k metal gates 112 may further include an interfacial layer (e.g., $SiO_2$) (not shown) between the high-k dielectric layer 108 and the fins 104. The interfacial layer may be formed using chemical oxidation, thermal oxidation, atomic layer deposition (ALD), chemical vapor deposition (CVD), and/or other suitable methods. The materials of the high-k dielectric layer 108 and the conductive layer 110 have been discussed above with reference to FIGS. 1A-1C. The high-k dielectric layer 108 may include one or more layers of high-k dielectric material, and may be deposited using CVD, ALD and/or other suitable methods. The conductive layer 110 may include one or more work function metal layers and a metal fill layer, and may be deposited using methods such as CVD, PVD, plating, and/or other suitable processes.

Figure 8:
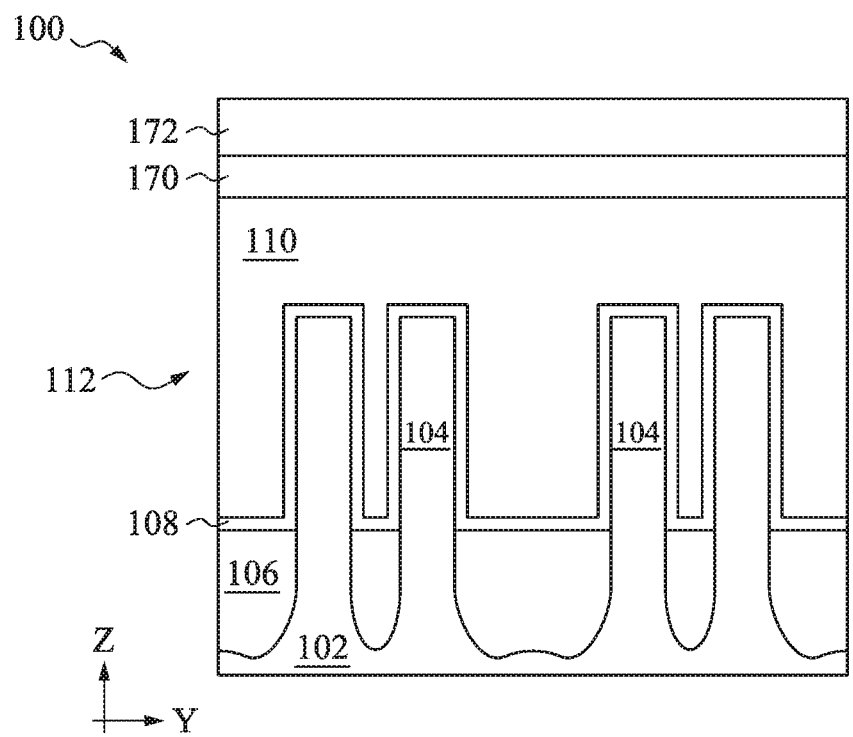

At operation 212, the method 200 (FIG. 2B) forms one or more hard mask layers over the device 100, such as shown in FIG. 8 which is a cross-sectional view of the device 100 along the B-B line of FIG. 1A at this fabrication stage. Two hard mask layers 170 and 172 are illustrated in this example. In an embodiment, the hard mask layer 170 includes titanium nitride, while the hard mask layer 172 includes silicon nitride. In the present embodiment, the material for the hard mask layer 170 is chosen to have good adhesion with the conductive layer 110 yet not reactive with the conductive layer 110. The hard mask layers 170 and 172 may be deposited using CVD, PVD, ALD, or other suitable methods.

Figure 9:
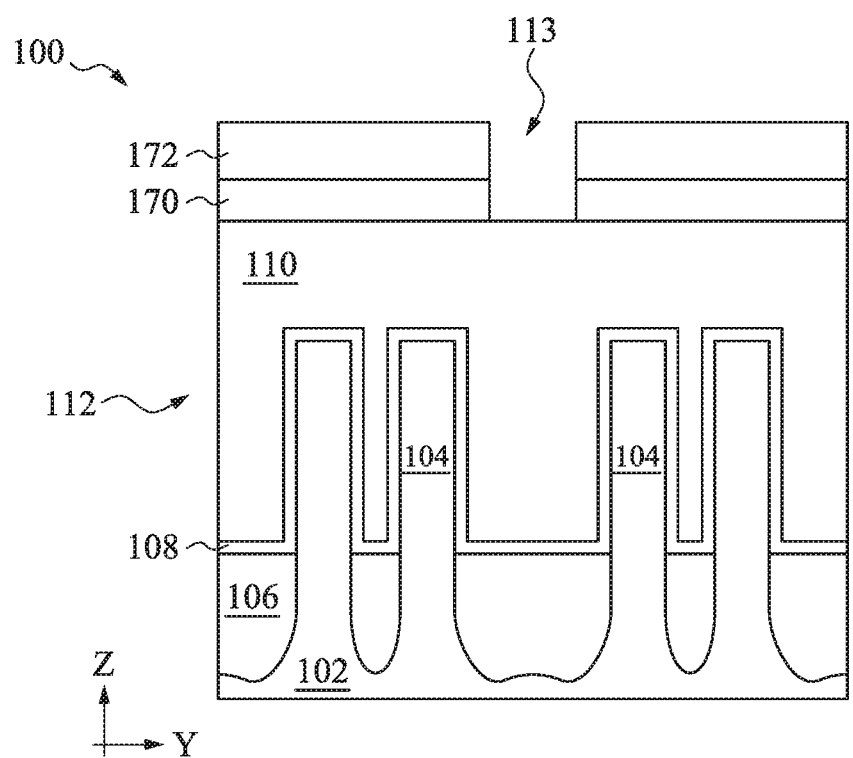

At operation 214, the method 200 (FIG. 2B) patterns the one or more hard mask layers to form a pattern hard mask, such as shown in FIG. 9 which is a cross-sectional view of the device 100 along the B-B line of FIG. 1A at this fabrication stage. Referring to FIG. 9, the hard mask layers 170 and 172 are patterned (e.g., etched) to provide an opening 113 that exposes the conductive layer 110. In an example, the operation 214 may form a patterned photoresist over the hard mask layers 170 and 172 by photoresist coating, exposing, post-exposure baking, and developing. The patterned photoresist corresponds to the patterns of the dielectric layer 114 in FIG. 1A. Then, the operation 214 etches the hard mask layers 170 and 172 using the patterned photoresist as an etch mask to form the opening 113. The etching process may include wet etching, dry etching, reactive ion etching, or other suitable etching methods. The patterned photoresist is removed thereafter, for example, by resist stripping. It is noted that the sidewalls of the opening 113 at the hard mask layers 170/172 are vertical or nearly vertical.

Figure 10:
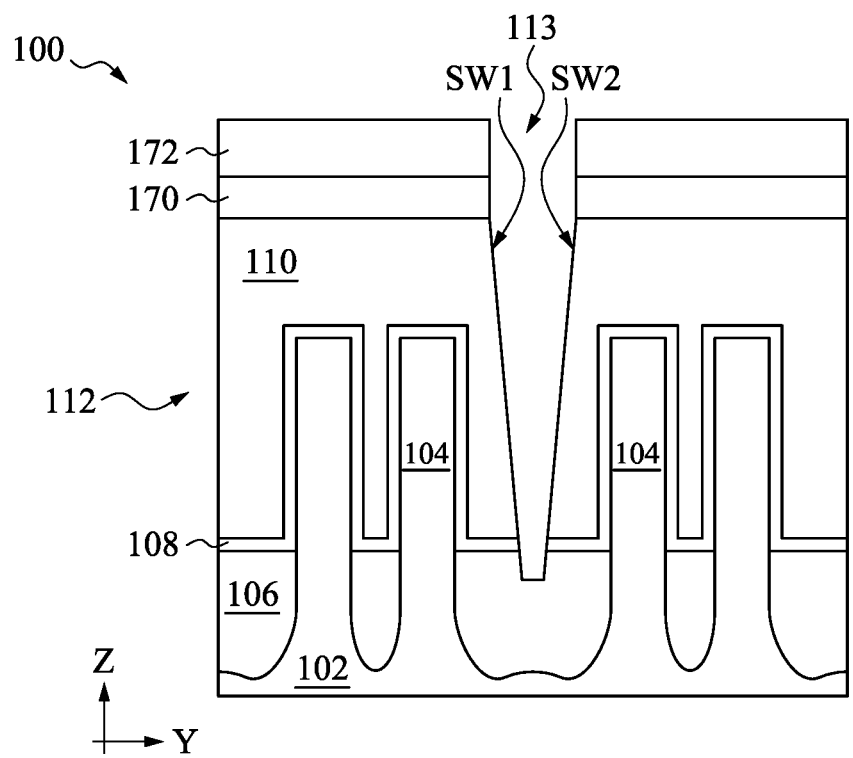

At operation 216, the method 200 (FIG. 2B) etches the high-k metal gate 112 through the opening 113. The patterned hard mask layers 170 and 172 protect the rest of the high-k metal gate 112 from the etching process. Referring to FIG. 10, the operation 216 extends the opening 113 down and through the high-k metal gate 112 and into the isolation structure 106. Particularly, the operation 216 controls the etching process to produce the slanted sidewalls SW1 and SW2, discussed above with reference to FIG. 1C. The etching process may use one or more etchants or a mixture of etchants that etch the various layers in the high-k metal gate 112.

In an exemplary embodiment, the conductive layer 110 includes TiSiN, TaN, TiN, W, or a combination thereof. To etch such a conductive layer and the high-k dielectric layer 108, the operation 216 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. Etching the high-k metal gate 112 with such a gas mixture tends to produce some polymers 115 (or polymeric materials) deposited on the sidewalls of the CMG trench 113 during the etching process. These polymers 115 slow down the etching towards the sidewalls, thereby producing the slanted sidewalls SW1 and SW2. In one example, the etchant includes a gas mixture of $Cl_2$, $O_2$, $CF_4$, $BCl_3$, and $CHF_3$. By adjusting the amount of $BCl_3$ in the gas mixture, the operation 216 may control the amount of $BO_xN_y$ polymer deposited on the sidewall of the CMG trench 113, thereby controlling the slope of the sidewalls SW1 and SW2. For example, the operation 216 may increase the ratio of $BCl_3$ in the gas mixture in order to increase the amount of deposited $BO_xN_y$ polymer. Alternatively or additionally, by adjusting the amount of $CHF_3$ in the gas mixture, the operation 216 may control the amount of $TiF_x$ and $NF_x$ polymer deposited on the sidewall of the CMG trench 113, thereby controlling the slope of the sidewalls SW1 and SW2. For example, the operation 216 may increase the ratio of $CHF_3$ in the gas mixture in order to increase the amount of deposited $TiF_x$ and $NF_x$ polymer. Still further, the operation 216 may adjust the ratio of carbon to fluorine in the gas mixture in order to control the amount of $C_xF_y$ polymer deposited on the sidewalls SW1 and SW2. For example, the operation 216 may replace $CF_4$ with $C_xF_y$, where x:y is greater than 1:4 (e.g., $C_4F_6$) in order to increase the amount of deposited $C_xF_y$ polymer. The above discussed etchant and the etching process may be applied to various materials suitable for the conductive layer 110 and the high-k dielectric 108, not limited to the exemplary materials TiSiN, TaN, TiN, and W discussed above.

Still further, the operation 216 may also control the etching bias voltage in addition to or alternative to controlling the etchant(s) as discussed above. A higher etching bias voltage (along the Z direction) tends to produce more vertical sidewalls in the CMG trench 113, while a lower etching bias voltage reduces the downward ion bombardment by the etchants, resulting in slanted sidewalls. In the present embodiment, the operation 216 may apply the etching bias voltage in the range of 50 to 100 V. Furthermore, the operation 216 may perform the etching process at a pressure of 5 to 20 mTorr, energy of 100 to 200 W, and a temperature of 75 to 125 degrees Celsius in the present embodiment. Various other values of etching bias voltage, etching pressure, etching energy, and etching temperature are possible. Also, to ensure the isolation between the left and right portions of the gate stack 112, the operation 216 performs some over-etching to extend the CMG trench 113 into the isolation structure 106. Such over-etching is carefully controlled to not expose the substrate 102.

Figure 11:
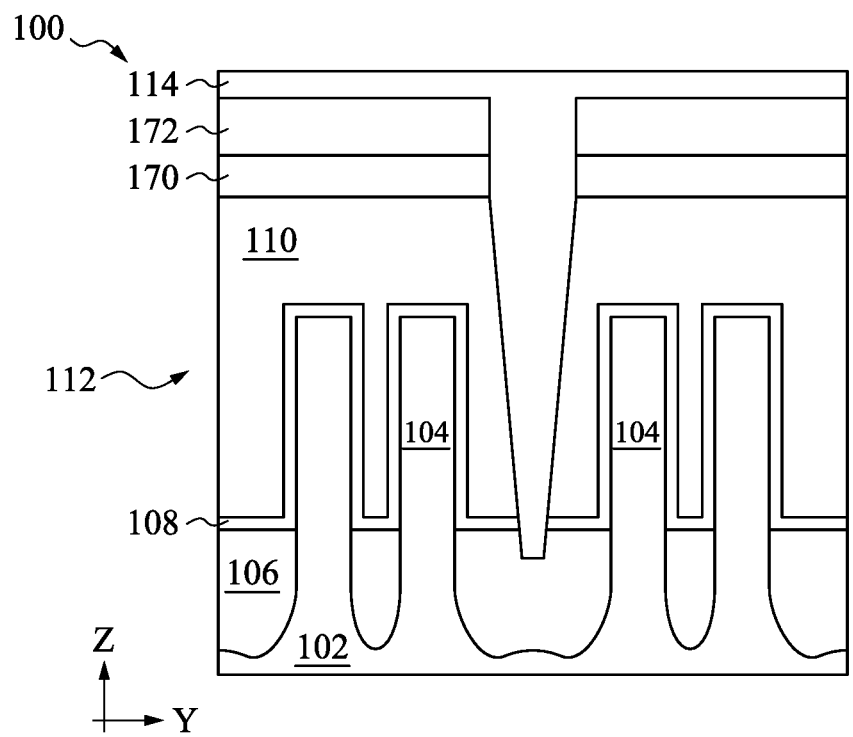

At operation 218, the method 200 (FIG. 2B) fills the CMG trench 113 with one or more dielectric materials to form the dielectric layer 114, such as shown in FIG. 11. Since the sidewalls (SW1 and SW2 of FIG. 10) of the gate stacks 112 contain metallic materials, at least the outer portion of the dielectric layer 114 (that is in direct contact with the sidewalls SW1 and SW2) is free of active chemical components such as oxygen. In the present embodiment, the outer portion of the dielectric layer 114 includes silicon nitride and is free of oxygen or oxide. It is noted that, since the high-k dielectric layer 108 includes oxygen, some oxygen content may eventually diffuse into some portions of the dielectric layer 114. However, such diffused oxygen is generally limited to the lower portions of the dielectric layer 114. The dielectric layer 114 may include some oxide in the inner portion thereof in some embodiments. Alternatively, the dielectric layer 114 may include one uniform layer of silicon nitride and is free of oxide. The dielectric layer 114 may be deposited using CVD, PVD, ALD, or other suitable methods. In the present embodiment, the dielectric layer 114 is deposited using ALD to ensure that it completely fills the CMG trench 113.

Figure 12:
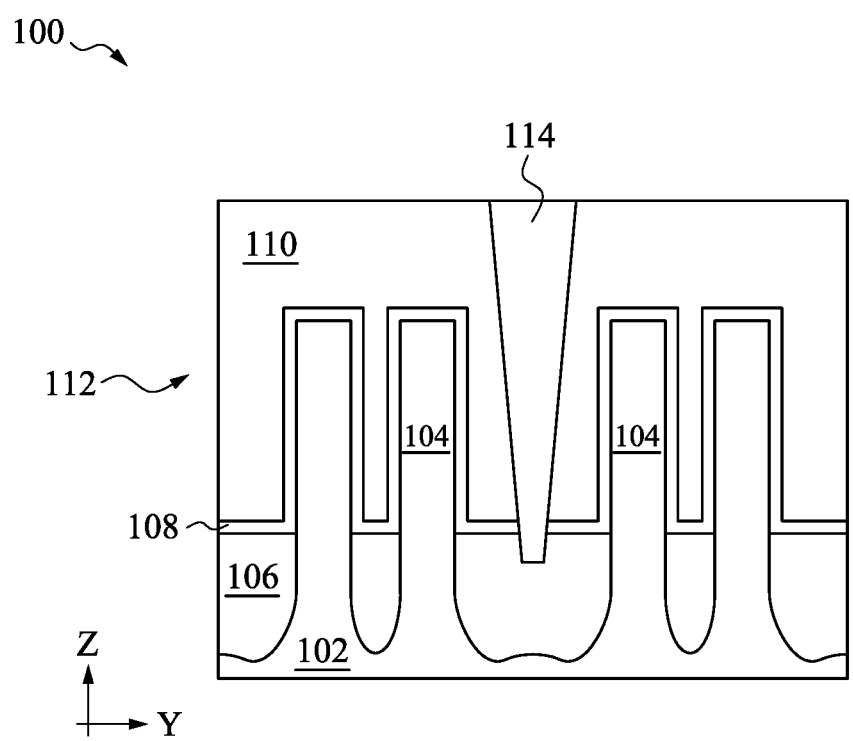

At operation 220, the method 200 (FIG. 2B) performs one or more CMP processes to remove excessive dielectric layer 114 (the portion outside the CMG trench 113) and the hard mask layers 172 and 170. In an embodiment, the hard mask layer 170 serves as a CMP stop when the hard mask layer 172 is removed by a CMP process. In another embodiment, the operation 220 may recess the conductive layer 110 (as well as the dielectric layer 114) to a desired HK MG height. The resulting structure is shown in FIG. 12.

At operation 222, the method 200 (FIG. 2B) performs further steps to complete the fabrication of the device 100. For example, the method 200 may form contacts and vias electrically connecting the S/D features 162 (FIG. 7A) and the gate stacks 112 and form metal interconnects connecting various transistors to form a complete IC.

Although not intended to be limiting, one or more embodiments of the present disclosure provide many benefits to a semiconductor device and the formation thereof. For example, embodiments of the present disclosure provide cut metal gate trenches with slanted sidewalls. The slanted sidewalls improve the filling of dielectric materials into the trenches which may have a high aspect ratio. This is particularly useful for small scaled devices. Further, embodiments of the present disclosure can be readily integrated into existing semiconductor manufacturing processes.

In one exemplary aspect, the present disclosure is directed to a semiconductor device. The device includes a substrate; a first fin and a second fin protruding out of the substrate; and a first high-k metal gate (HK MG) and a second HK MG, wherein the first HK MG is disposed over the first fin, and the second HK MG is disposed over the second fin. From a top view, the first and second fins are arranged lengthwise along a first direction, the first and second HK MG are arranged lengthwise along a second direction generally perpendicular to the first direction, and the first and second HK MG are aligned along the second direction. In a cross-sectional view cut along the second direction, the first HK MG has a first sidewall that is slanted from top to bottom towards the second HK MG, and the second HK MG has a second sidewall that is slanted from top to bottom towards the first HK MG.

In an embodiment of the device, the first sidewall forms a first angle with a normal of the substrate, and the first angle is within a range of 1 to 10 degrees. In a further embodiment, the first angle is within a range of 2 to 5 degrees. In another embodiment, the second sidewall forms a second angle with the normal of the substrate, and the second angle is within a range of 1 to 10 degrees. For example, the second angle is within a range of 2 to 5 degrees.

In an embodiment, the device further includes a dielectric material laterally between the first and second sidewalls. In a further embodiment, the dielectric material completely fills in space between the first and second sidewalls.

In another embodiment, a first distance is between the respective top of the first and second sidewalls, a second distance is between the respective bottom of the first and second sidewalls, and a ratio of the second distance to the first distance ranges from 0.4 to 0.8. In a further embodiment, the ratio of the second distance to the first distance ranges from 0.5 to 0.7.

In an embodiment of the device, a ratio of a height of the first HK MG to a distance between the respective top of the first and second sidewalls ranges from 3 to 10. For example, the ratio ranges from 5 to 7. In yet another embodiment, the device further includes an isolation structure between the first and second fins and under the first and second HK MG.

In another exemplary aspect, the present disclosure is directed to a semiconductor device. The device includes a substrate; first and second fins protruding out of the substrate; third and fourth fins protruding out of the substrate; a first high-k metal gate (HK MG) disposed over the first and second fins; and a second HK MG disposed over the third and fourth fins. From a top view, the first, second, third, and fourth fins are arranged lengthwise along a first direction, the first and second HK MG are aligned lengthwise along a second direction generally perpendicular to the first direction. In a cross-sectional view cut along the second direction, the first HK MG has a first sidewall, the second HK MG has a second sidewall opposite the first sidewall, and the first and second sidewalls form two angles with a normal of the substrate, wherein each of the angles is less than $$\tan^{-1}\left(\frac{1}{2 \times AR}\right)$$

where AR is a ratio of a height of the first HK MG to a distance between the respective top of the first and second sidewalls. Space between the first and second sidewalls is completely occupied by one or more dielectric materials. In some embodiments, each of the two angles ranges from 1.5 to 7 degrees.

In an embodiment of the device, in the cross-sectional view, a first distance is between the respective top of the first and second sidewalls, a second distance is between the respective bottom of the first and second sidewalls, and a ratio of the second distance to the first distance ranges from 0.4 to 0.8. In another embodiment of the device, the AR ranges from 4 to 8.

In yet another exemplary aspect, the present disclosure is directed to a method. The method includes providing a structure having: a substrate, fins protruding out of the substrate, and an isolation structure over the substrate and between adjacent fins, wherein the isolation structure is lower than the fins. The method further includes forming a gate over the isolation structure and the fins, wherein the gate includes a high-k dielectric layer and a conductive layer; and performing an etching process to the gate between two adjacent fins to expose the isolation structure, thereby separating the gate into at least a first portion and a second portion. The etching process is controlled so as to produce a first sidewall of the first portion and an opposing, second sidewall of the second portion, wherein the first and second sidewalls provide a top opening wider than a bottom opening.

In an embodiment of the method, the etching process includes dry etching with a bias voltage ranging from 50 to 100 V. in an embodiment of the method, the conductive layer includes tungsten (W), and the etching process uses a gas mixture containing CxFy where x:y is greater than 1:4.

In an embodiment of the method, the etching process includes dry etching with a gas mixture of $Cl_2$, $O_2$, a carbon-and-fluorine containing gas, a bromine-and-fluorine containing gas, and a carbon-hydrogen-and-fluorine containing gas. In yet another embodiment of the method, the etching process includes dry etching with an etchant having atoms of chlorine, fluorine, bromine, oxygen, hydrogen, and carbon.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate, semiconductor fins over the substrate, and an isolation structure over the substrate and between adjacent semiconductor fins;
forming a first gate structure engaging the semiconductor fins;
depositing an inter-layer dielectric layer over the semiconductor fins and the first gate structure;
depositing a protective layer on the inter-layer dielectric layer;
after the depositing of the protective layer, removing the first gate structure, resulting in a first trench;
depositing a second gate structure into the first trench, wherein the second gate structure includes a high-k dielectric layer and a metal layer over the high-k dielectric layer;
forming a first mask layer over the second gate structure, wherein the first mask layer includes titanium nitride;
forming a second mask layer over the first mask layer, wherein the second mask layer includes silicon nitride;
patterning the first and the second mask layers to have an opening through both the first and the second mask layers and exposing a portion of the second gate structure between two adjacent semiconductor fins;
etching the second gate structure through the opening to produce a second trench, wherein the etching of the second gate structure includes applying a gas mixture of $Cl_2$, $O_2$, $CF_4$, $BCl_3$, and $CHF_3$ and adjusting an amount of $BCl_3$ in the gas mixture, an amount of $CHF_3$ in the gas mixture, or a ratio of carbon to fluorine in the gas mixture such that the second trench is provided with tapered sidewalls, wherein the second trench is wider at top than at bottom and partially extends into the isolation structure, wherein the etching of the second gate structure comprises a process temperature between 75° C. and 125° C.;
depositing a dielectric material into the second trench and over the first and the second mask layers to form a dielectric layer; and
performing chemical mechanical planarization (CMP) processes to the dielectric layer and the first and the second mask layers, wherein the first mask layer serves as a CMP stop when the second mask layer is removed by one of the CMP processes.

2. The method of claim 1, wherein the etching of the second gate structure also etches the isolation structure.

3. A method, comprising:
providing a structure having:
a substrate,
fins over the substrate, each of the fins comprising a channel region and a source/drain region adjacent the channel region,
an isolation structure between adjacent fins and lower than the fins,
source/drain features disposed over the source/drain regions,
a contact etch stop layer (CESL) over the source/drain features,
an inter-layer dielectric layer over the CESL, and
a protective layer disposed over the inter-layer dielectric layer;
forming a gate structure over the isolation structure and the fins such that top surfaces of the gate structure and the protective layer are coplanar, wherein the gate structure includes one or more layers of metallic materials;

forming a patterned mask over the gate structure, wherein the patterned mask provides an opening exposing a portion of the gate structure between two adjacent fins, wherein the patterned mask includes a first mask layer having titanium nitride and a second mask layer having silicon nitride, the second mask layer is over the first mask layer, and the opening is through both the first and the second mask layers;

etching the gate structure through the opening to produce a trench, wherein the etching of the gate structure includes applying a gas mixture of $Cl_2$, $O_2$, $CF_4$, $BCl_3$, and $CHF_3$ and adjusting an amount of $BCl_3$ in the gas mixture or an amount of $CHF_3$ in the gas mixture such that the trench is provided with slanted sidewalls, wherein the trench becomes narrower as it approaches the isolation structure and partially extends into the isolation structure, wherein the etching of the gate structure comprises a process temperature between 75° C. and 125° C.;

depositing a dielectric material into the trench and over the first and the second mask layers to form a dielectric layer;

performing a chemical mechanical planarization (CMP) process to the dielectric layer and the second mask layer, wherein the first mask layer serves as a CMP stop when the second mask layer is removed by the CMP process; and performing another CMP process to the first mask layer.

4. The method of claim 3, wherein the one or more layers of metallic materials include TiSiN, TaN, TiN, W, or a combination thereof.

5. The method of claim 3, wherein the slanted sidewalls are also sidewalls of the gate structure, and wherein the etching of the gate structure is tuned such that each of the slanted sidewalls forms an angle with a normal of the substrate and the angle is less than $$\tan^{-1}\left(\frac{1}{2 \times AR}\right)$$

where AR is a ratio of a height of the gate structure to a width of a top opening of the trench.

6. A method, comprising:
providing a structure having:
a substrate,
fins protruding out of the substrate, each of the fins comprising a channel region and a source/drain region adjacent the channel region,
an isolation structure over the substrate and between adjacent fins, wherein the isolation structure is lower than the fins,
source/drain features disposed over the source/drain regions,
a contact etch stop layer (CESL) over the source/drain features,
an inter-layer dielectric layer over the CESL, and
a protective layer disposed over the inter-layer dielectric layer;
forming a gate structure over the isolation structure and the fins such that top surfaces of the gate structure and the protective layer are coplanar, wherein the gate structure includes a high-k dielectric layer and a conductive layer over the high-k dielectric layer;
forming a patterned mask over the gate structure, wherein the patterned mask includes a second mask layer having silicon nitride over a first mask layer having titanium nitride, the patterned mask provides an opening through both the first and the second mask layers and exposing a portion of the gate structure between two adjacent fins;
performing an etching process to the gate structure through the opening to expose the isolation structure, thereby separating the gate structure into at least a first portion and a second portion, wherein the etching process includes applying a gas mixture of $Cl_2$, $O_2$, $CF_4$, $BCl_3$, and $CHF_3$ and adjusting a ratio of carbon to fluorine in the gas mixture so as to produce a first sidewall of the first portion and an opposing, second sidewall of the second portion, wherein the first and second sidewalls provide a top opening wider than a bottom opening, wherein etching process comprises a process temperature between 75° C. and 125° C., wherein the first sidewall and the second sidewall partially extend into the isolation structure;
depositing a dielectric layer over the first and the second sidewalls and over the first and the second mask layers; and
performing chemical mechanical planarization (CMP) processes to remove a portion of the dielectric layer, the second mask layer, and the first mask layer, wherein the first mask layer serves as a CMP stop when the second mask layer is removed.

7. The method of claim 6, wherein the etching process includes dry etching with a bias voltage ranging from 50 V to 100 V.

8. The method of claim 6, wherein the conductive layer includes tungsten (W), and the gas mixture includes $C_xF_y$, where x:y is greater than 1:4.

9. The method of claim 1, wherein the metal layer of the second gate structure includes TiSiN, TaN, TiN, W, or a combination thereof.

10. The method of claim 6, wherein the conductive layer of the gate structure includes TiSiN, TaN, TiN, W, or a combination thereof.

11. The method of claim 1, wherein the etching of the second gate structure simultaneously deposits a polymer over the tapered sidewalls of the second trench.

12. The method of claim 11, wherein the etching of the second gate structure includes increasing a ratio of $BCl_3$ in the gas mixture to increase an amount of the polymer deposited over the tapered sidewalls of the second trench.

13. The method of claim 11, wherein the etching of the second gate structure includes increasing a ratio of $CHF_3$ in the gas mixture to increase an amount of the polymer deposited over the tapered sidewalls of the second trench.

14. The method of claim 11, wherein the etching of the second gate structure includes increasing the ratio of carbon to fluorine in the gas mixture to increase an amount of the polymer deposited over the tapered sidewalls of the second trench.

15. The method of claim 3, wherein the etching of the gate structure simultaneously deposits a polymer over the slanted sidewalls of the trench.

16. The method of claim 6, wherein the performing of the etching process includes increasing the ratio of carbon to fluorine in the gas mixture.

17. The method of claim 1, wherein the CMP processes include, after removing the first and the second mask layers, recessing the second gate structure.

18. The method of claim 3, further comprising recessing the gate structure.

19. The method of claim 6, wherein the performing of the chemical mechanical planarization (CMP) processes further includes recessing the gate structure.

* * * * *